United States Patent [19]
Ranaudo et al.

[11] Patent Number: 5,982,125
[45] Date of Patent: Nov. 9, 1999

[54] AUTOMATIC DOOR TEST APPARATUS

[75] Inventors: Anthony R. Ranaudo, Bethlehem; Sanjay Kamani, Unionville, both of Conn.; Dwight Reed, Springfield, Tenn.

[73] Assignee: The Stanley Works, New Britain, Conn.

[21] Appl. No.: 09/185,560

[22] Filed: Nov. 4, 1998

[51] Int. Cl.$^6$ .............................. G01R 31/02; E05F 15/20
[52] U.S. Cl. ........................... 318/466; 318/490; 324/537
[58] Field of Search ...................................... 318/264, 265, 318/266, 286, 466, 467, 468, 490; 324/500, 511, 512, 522, 523, 527, 537

[56] References Cited

U.S. PATENT DOCUMENTS

| | | | |
|---|---|---|---|
| 4,491,917 | 1/1985 | Higgins et al. | 364/424.059 |
| 5,127,190 | 7/1992 | Hein et al. | 49/31 |
| 5,274,312 | 12/1993 | Gerstenkorn | 318/617 |

*Primary Examiner*—Bentsu Ro
*Attorney, Agent, or Firm*—Alix, Yale & Ristas, LLP

[57] ABSTRACT

A test device for testing automatic door systems has a test circuit including a display, a micro-controller, a memory for storing data and a test program, and a control switch for controlling operation of the test program by the micro-controller. The test device is installed by interposing the test circuit between the controller and sensors of the automatic door system. A selector switch on the test device is moveable between first and second positions. When the selector switch is in the first position, it completes a data path between the test circuit and the controller and blocks the exchange of data between the sensors and the test circuit and the first connector. When the selector switch is in the second position, it completes a data path between the test circuit and the second connector and blocks the exchange of data between the controller and the test circuit and the second connector. Pushing the control switch steps the micro-controller through the test program to individually test the controller and each of the sensors.

22 Claims, 8 Drawing Sheets

AUTOMATIC DOOR TEST APPARATUS

BACKGROUND OF THE INVENTION

This invention relates generally to automatically opening doors. More particularly, the present invention relates to apparatus for testing the door controller and door sensors of an automatic door system.

Automatic door systems of a type which are automatically operable for initiating an opening sequence upon sensing the motion or the presence of traffic at the doorway or receiving a command from a push plate, card reader, mat or other operation initiating device are now commonplace. A number of automatic door systems employ infrared sensors to initiate the door opening sequence. The sensors sense traffic approaching the doorway by detecting changes in received active or passive infrared radiation. Infrared sensors also function as safety devices to ensure that the doors do not inadvertently close.

Some conventional door applications employ multiple sensor units. For example, an approach sensor unit may be positioned at each side of the door to sense approaching traffic. The approach sensors may be conventional microwave field distortion devices or active infrared motion sensing devices. For one-way doors, a single approach sensor may be positioned to detect traffic approaching from the approved direction. A threshold or safety sensor may be positioned to cover the threshold area. Such safety sensors are conventionally presence sensing devices such as pulsed infrared beams.

The controller for the automatic door system must be capable of performing sophisticated signal processing. The controller typically must open the door upon receipt of an appropriate signal from an approach sensor, hold the door open for a predetermined period of time or until the safety sensor no longer senses a presence in the threshold area, and close the door. It should be noted that because of the movement of the doors, the controller and sensors which are employed in the automatic door system must take into account the movement of the door itself. In addition, the sensor and controller must accommodate changes in the background environment.

Periodically, the automatic door system must be tested to ensure that the doors will operate as required. In the event of a component or system failure, testing is also required to troubleshoot and repair the system. With the increasing complexity of the control systems and the sensors, the equipment required to perform such testing has grown in complexity and expense.

SUMMARY OF THE INVENTION

Briefly stated, the invention in a preferred form is a device for testing automatic door systems which has a test circuit, including a display, a micro-controller, a memory for storing data and a test program, and a control switch for controlling operation of the test program by the micro-controller. The test device is installed by connecting the data and power connector of the controller and the data connector of the sensors to the test circuit. A selector switch on the test device is moveable between first and second positions. When the selector switch is in the first position, it completes a data path between the test circuit and the controller and blocks the exchange of data between the sensors and the test circuit and the first connector. When the selector switch is in the second position, it completes a data path between the test circuit and the second connector and blocks the exchange of data between the controller and the test circuit and the second connector.

The automatic door system provides power to the test device via its connection with the controller. The test circuit includes a first voltage comparator for monitoring the automatic door system power and the display comprises an LED for indicating the status of the automatic door system power. A second and third voltage comparator of the test circuit are used to monitor the voltage of the controller and sensor clock lines and data lines during testing. The display also includes an alphanumeric indicator for displaying the test results.

When the test device is installed between the controller and the sensors, the first voltage comparator senses the controller voltage and lights the LED if the sensed voltage is above a predetermined value. The test device micro-controller then prompts the test personnel to place the selector switch in the first position to test the controller. Pressing the control switch steps the micro-controller through the test program such that the second voltage comparator monitors first the voltage of the controller clock line and then the third voltage comparator monitors the data line and provides an indication on the alphanumeric indicator whether or not the sensed voltage is above or below a predetermined minimum value. Next the micro-controller is directed to monitor the signals on the clock line and the data line and provide an indication whether or not the sensed signals correspond to signals which are stored in the memory, thereby completing the testing of the controller.

The micro-controller then prompts the test personnel to move the selector switch to the second position. Pressing the control switch continues to step the micro-controller through the test program such that the second and third voltage comparators monitor the voltage of the sensor clock line and data line and provides an indication on the alphanumeric indicator whether or not the sensed voltage is above or below a predetermined minimum value.

The software then directs the micro-controller to test each sensor. The micro-controller establishes communication with a designated sensor and causes the sensor emitter to emit a signal into a detection zone. If an object is within the zone, the sensor detector detects a return signal. The micro-controller then provides an indication on the alphanumeric indicator whether or not the sensor detector detects the return signal. If the detector is not receiving a return signal, the test personnel places an object in the zone. The sensor performance is satisfactory if the indication changes to show that the detector is now receiving the return signal. If the detector is receiving a return signal, the test personnel covers the emitter or the receiver. The sensor performance is satisfactory if the indication changes to show that the detector is no longer receiving the return signal.

It is an object of the invention to provide a new and improved device and method for testing an automatic door system.

It is also an object of the invention to provide a new and improved device for testing an automatic door system which device has an efficient construction.

It is further an object of the invention to provide a new and improved method of testing an automatic door system which method is simple and takes a minimum of time.

Other objects and advantages of the invention will become apparent from the drawings and specification.

BRIEF DESCRIPTION OF THE DRAWINGS

The present invention may be better understood and its numerous objects and advantages will become apparent to those skilled in the art by reference to the accompanying drawings in which.

DETAILED DESCRIPTION OF THE PREFERRED EMBODIMENT

Figure 1:
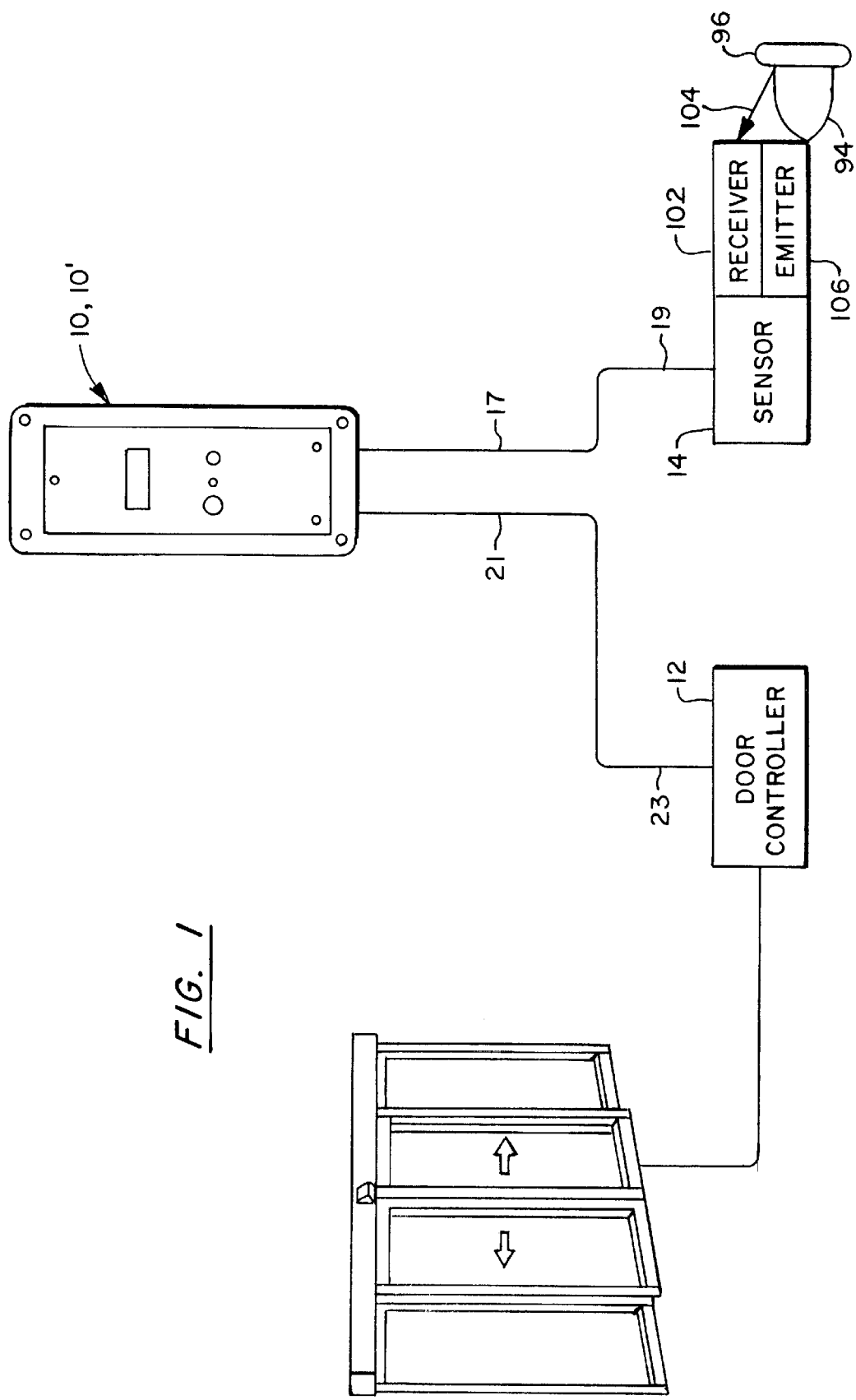
FIG. 1 is a schematic diagram of a test device in accordance with the present invention installed in an automatic door system.

With reference to the drawings wherein like numerals represent like parts throughout the several figures, an automatic door test device in accordance with the present invention is generally designated by the numeral 10. The test device 10 is interposed between the controller 12 and the sensors 14 of an automatic door system, as shown in FIG. 1. In a preferred embodiment, the test device 10 is a hand-held unit which is removed after the testing is complete. Alternatively, the test device 10' may be permanently installed in the automatic door system.

Figure 2:
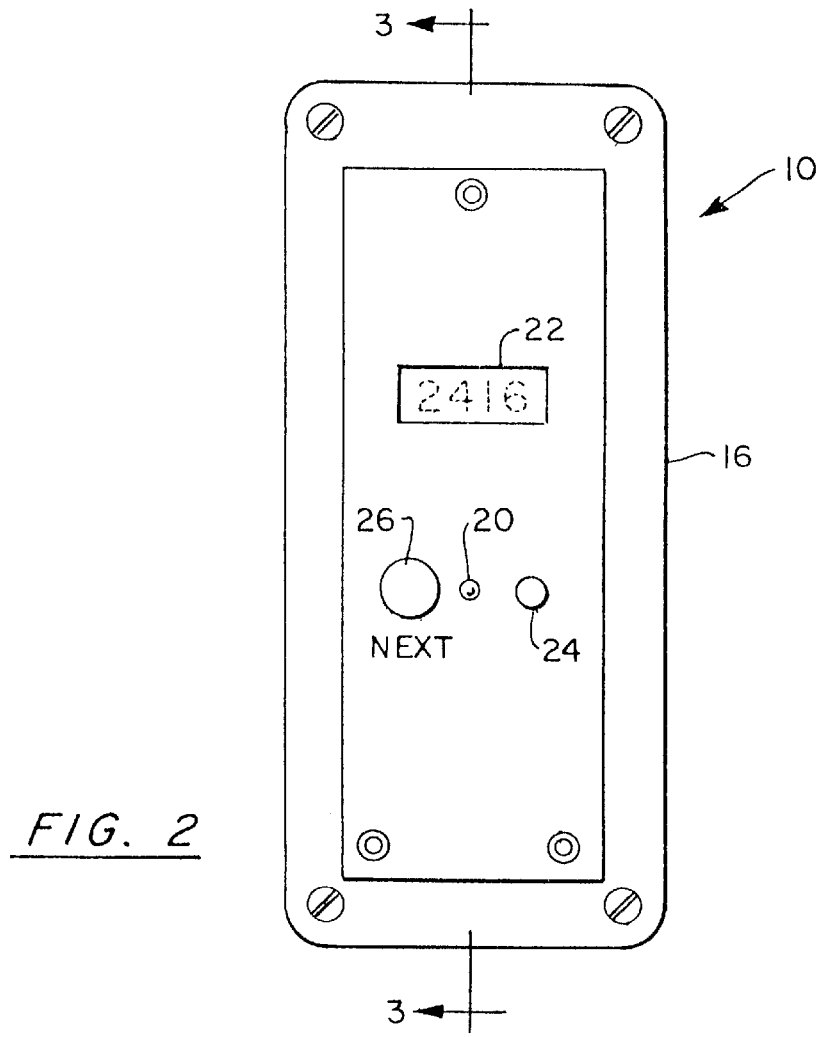
FIG. 2 is a top plan view of the test device of FIG. 1.
Figure 3:
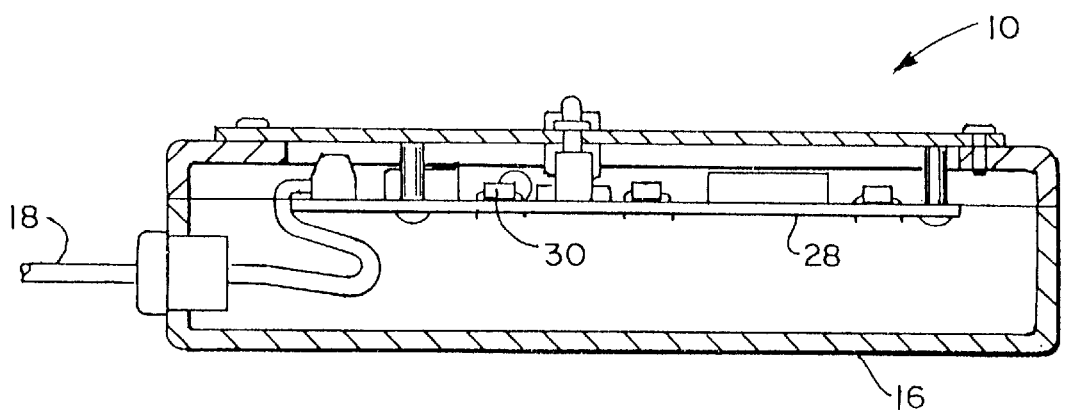
FIG. 3 is a cross-section view of the test device taken along line 3—3 of FIG. 2.
Figure 4:
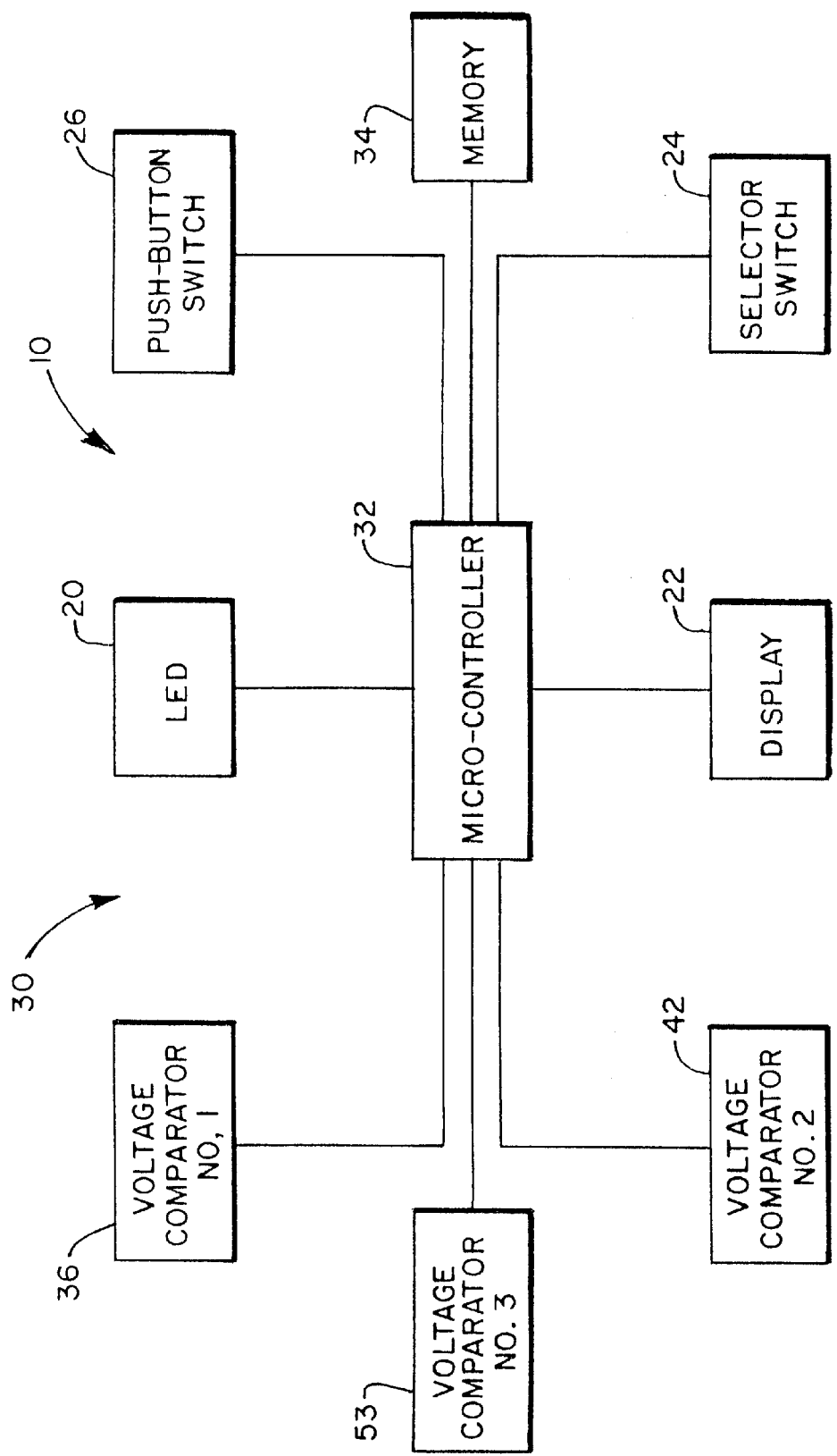
FIG. 4 is a schematic diagram of the test device of FIG. 1.

With reference to FIGS. 2 and 3, the hand-held test device 10 includes a housing 16 having externally accessible fiber optic or electrical connectors 18 for connecting the device 10 to the automatic door system. For example, a test device 10 for use with a Stanley Access Technologies Sentrex 3™ automatic door system will include a first connector 17 for connecting to the sensor Flex Link™ cable 19 and a second connector 21 for connecting to the controller TB2 connector 23. The test device includes two externally-visible indicators, an LED 20 and a four digit alphanumeric display 22. The operators for a two-position selector switch 24 and a push-button switch 26 extend through the housing 16 and are externally accessible.

A circuit board 28 mounted within the housing 16 includes an electrical circuit 30 which is electrically connected to the connectors 18, the LED 20, the alphanumeric display 22, the selector switch 24 and the push-button switch 26. The electrical circuit 30 includes a micro-controller 32 and a memory 34 for storing test data and control programs. The memory 34 may be integral with the micro-controller 32 or comprise one or more separate memory units. Preferably, the test device 10 receives its power from the automatic door system and does not require an internal power supply. As a personnel and equipment safety precaution, power to the automatic door system is secured until the test device 10 has been completely installed.

The electrical circuit 30 includes a first voltage comparator 36 which monitors the power supply voltage and lights the LED 20 when the power being received by the test device 10 is above a preset level. The LED 20 will not turn on if the voltage is below the value required to supply the automatic door system sensors 14. The value of the preset voltage level may be adjusted with a potentiometer to accommodate the range of sensors 14 that may be used by the automatic door system.

With reference to FIGS. 2 and 3, the test device 10 may be used to test either the automatic door system controller 12 or the automatic door system sensors 14, but not both at the same time. The micro-controller 32 is programmed to sequentially test the automatic door system controller 12 first and the sensors 14 second. Consequently, the micro-controller 32 will scroll a "SWITCH TO MICRO" message 38 across the alphanumeric display 22, indicating that the two-position selector switch 24 should be toggled to the micro-controller position. This action selects the automatic door system controller 12 for testing and isolates the data signals from the sensors 14. Such isolation is required to isolate failures between the controller 12 and the sensors 14.

Figure 5A:
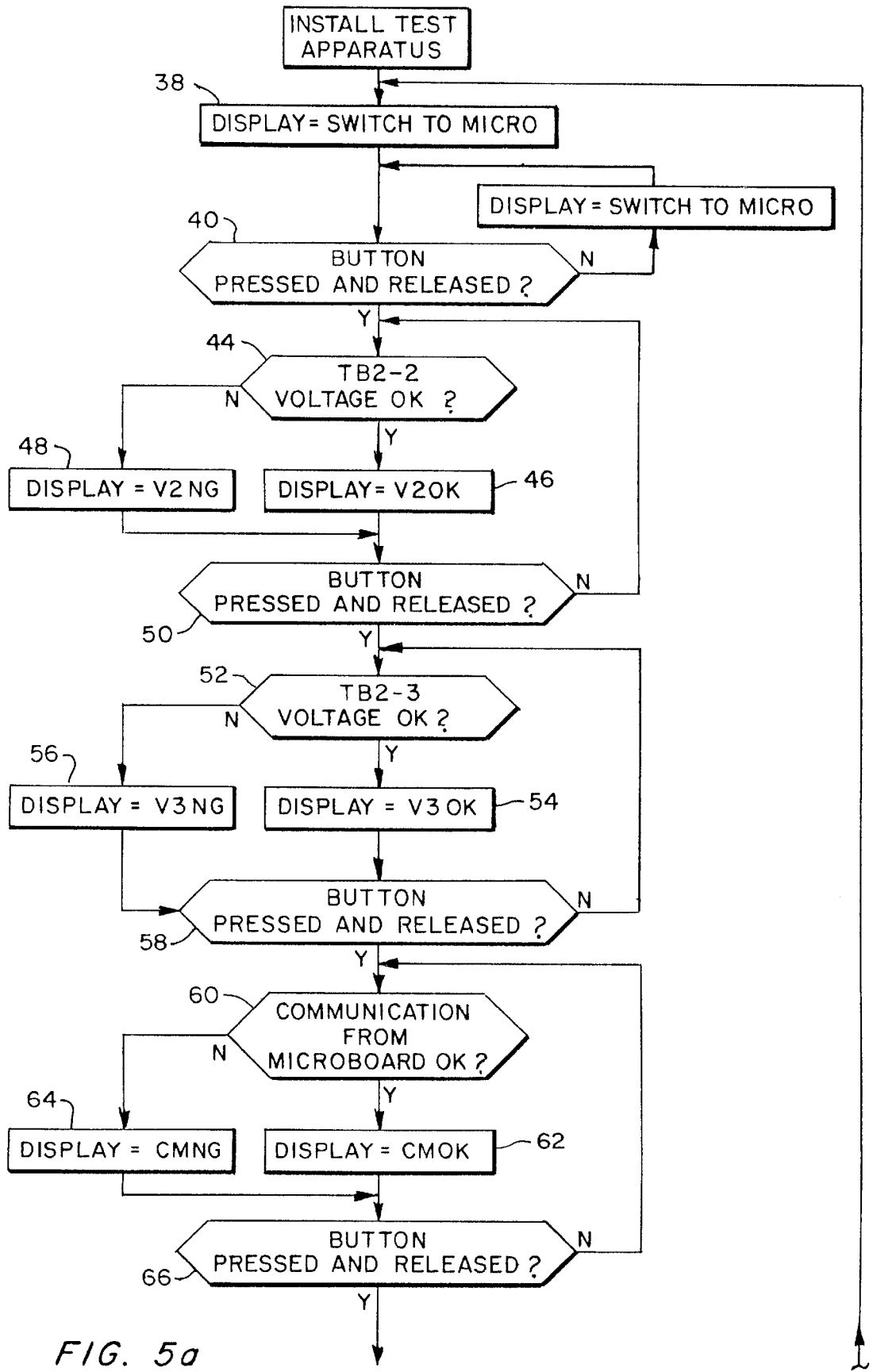
FIGS. 5a, 5b and 5c are a flow diagram illustrating the operation of the test device of FIG. 1.
Figure 5B:
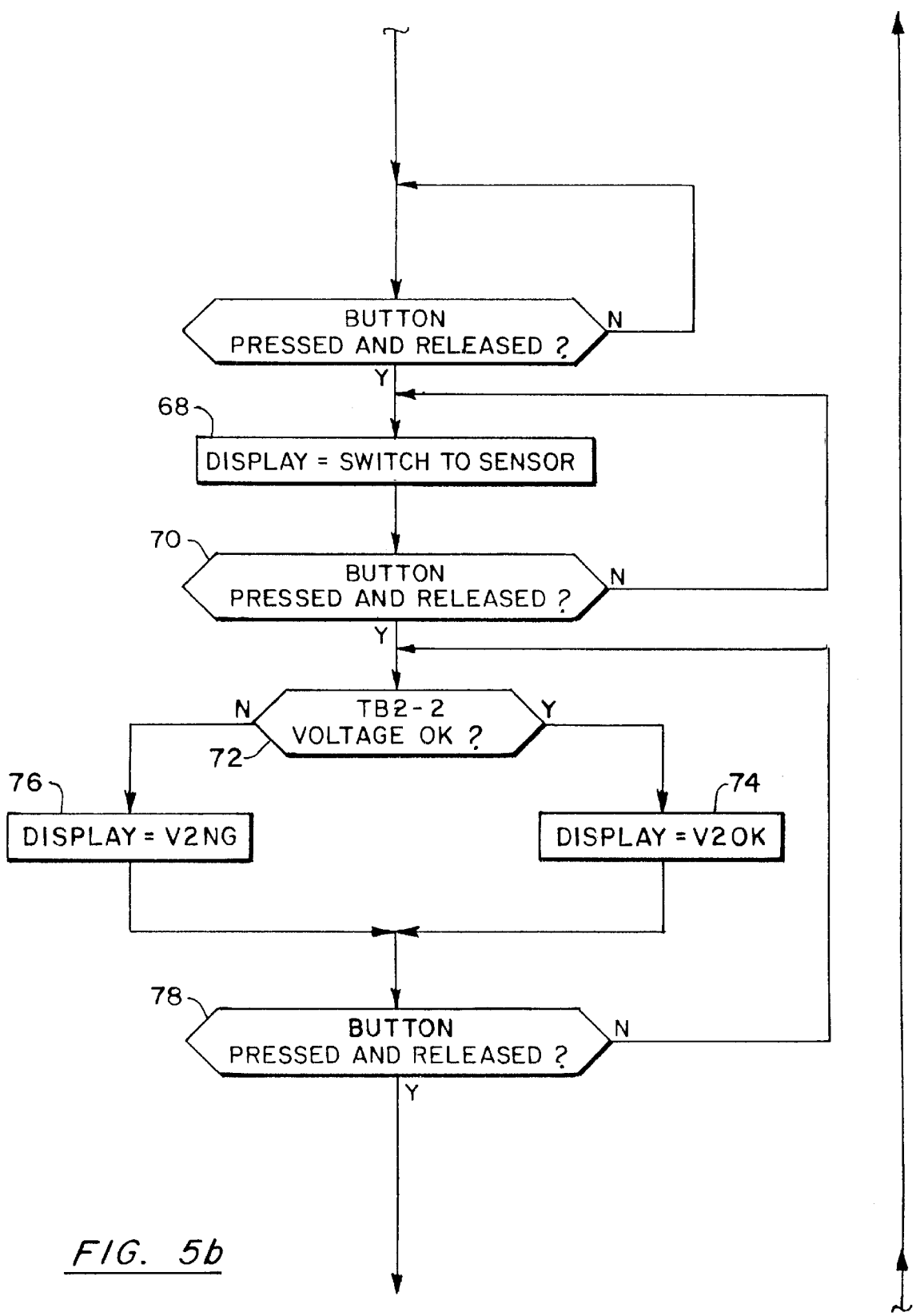
Figure 5C:
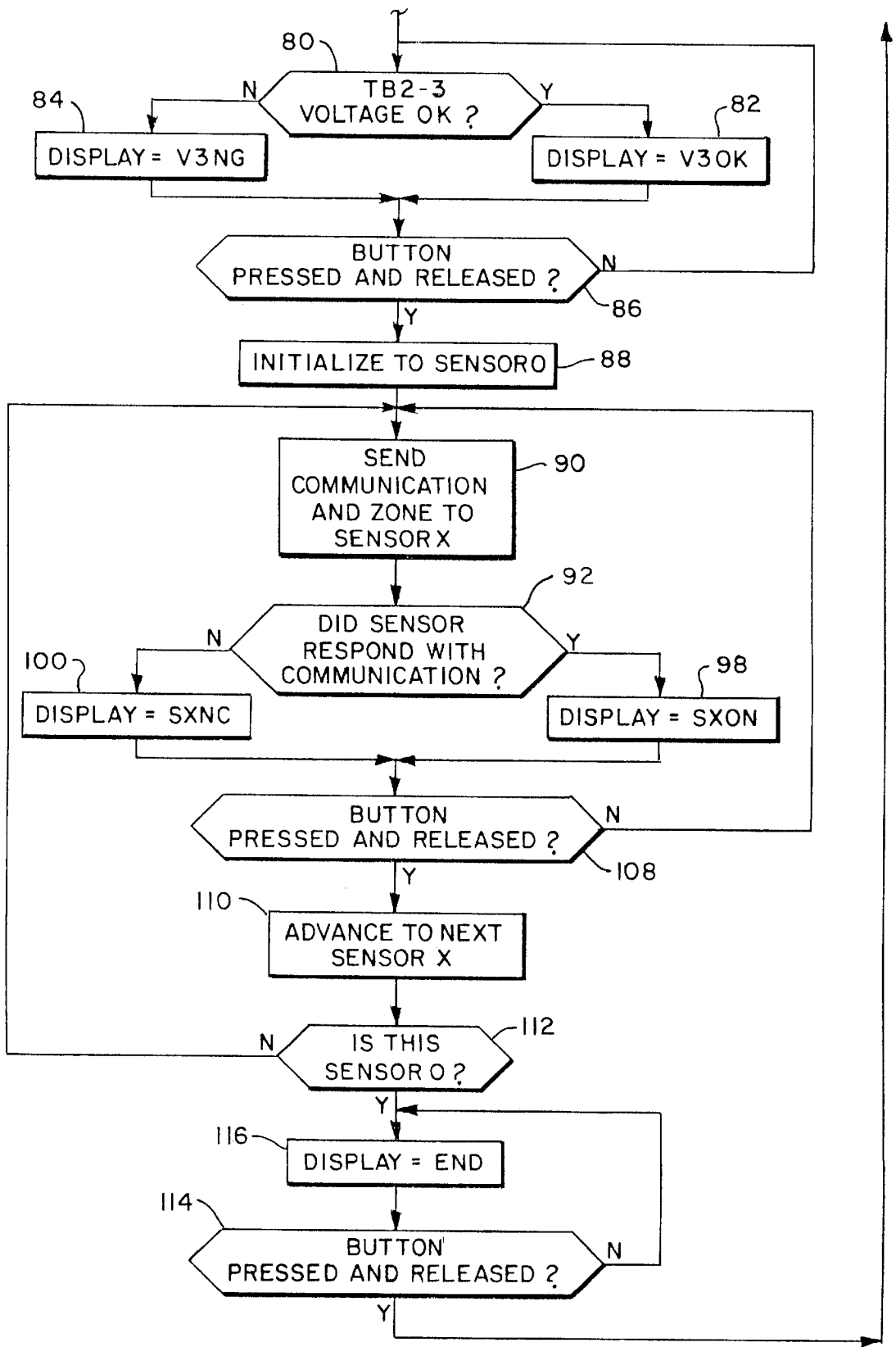

The push-button switch 26 is used to step the test device 10 through the various tests. With reference to the operational diagram of FIGS. 5a–5c as employed for a Sentrex 3™ automatic door system, pressing 40 the push-button switch 26 causes a second voltage comparator 42 portion of the circuit 30 to monitor 44 the voltage on the controller clock line. The micro-controller 32 will send a signal to the display to indicate whether the clock line voltage (V2) is above (V20K) 46 or below (V2NG) 48 a predetermined minimum level. Pressing 50 the push-button 26 steps the micro-controller to monitor 52 the data line voltage with the third voltage comparator 53. The micro-controller will send a signal to the display to indicate whether the data line voltage (V3) is above (V30K) 54 or below (V3NG) 56 a predetermined minimum level. If either V2NG 48 or V3NG 56 is displayed, the controller 12 is defective.

Pressing 58 the push-button 26 again steps the micro-controller 32 to monitor 60 the signals on the clock and data lines. If the signals being sent by the automatic door system controller correspond to correct signals, the micro-controller will send a signal to the display to indicate that the controller communications are good (CMOK) 62. If the signals do not correspond to correct signals the micro-controller will send a signal to the display to indicate that the controller communications are no good (CMNG) 64. On the completion of this test, pressing 66 the push-button 26 will cause the micro-controller to scroll a "SWITCH TO SENSOR" message 68 across the alphanumeric display 22, indicating that the two-position selector switch 24 should be toggled to the sensor position.

Figure 6:
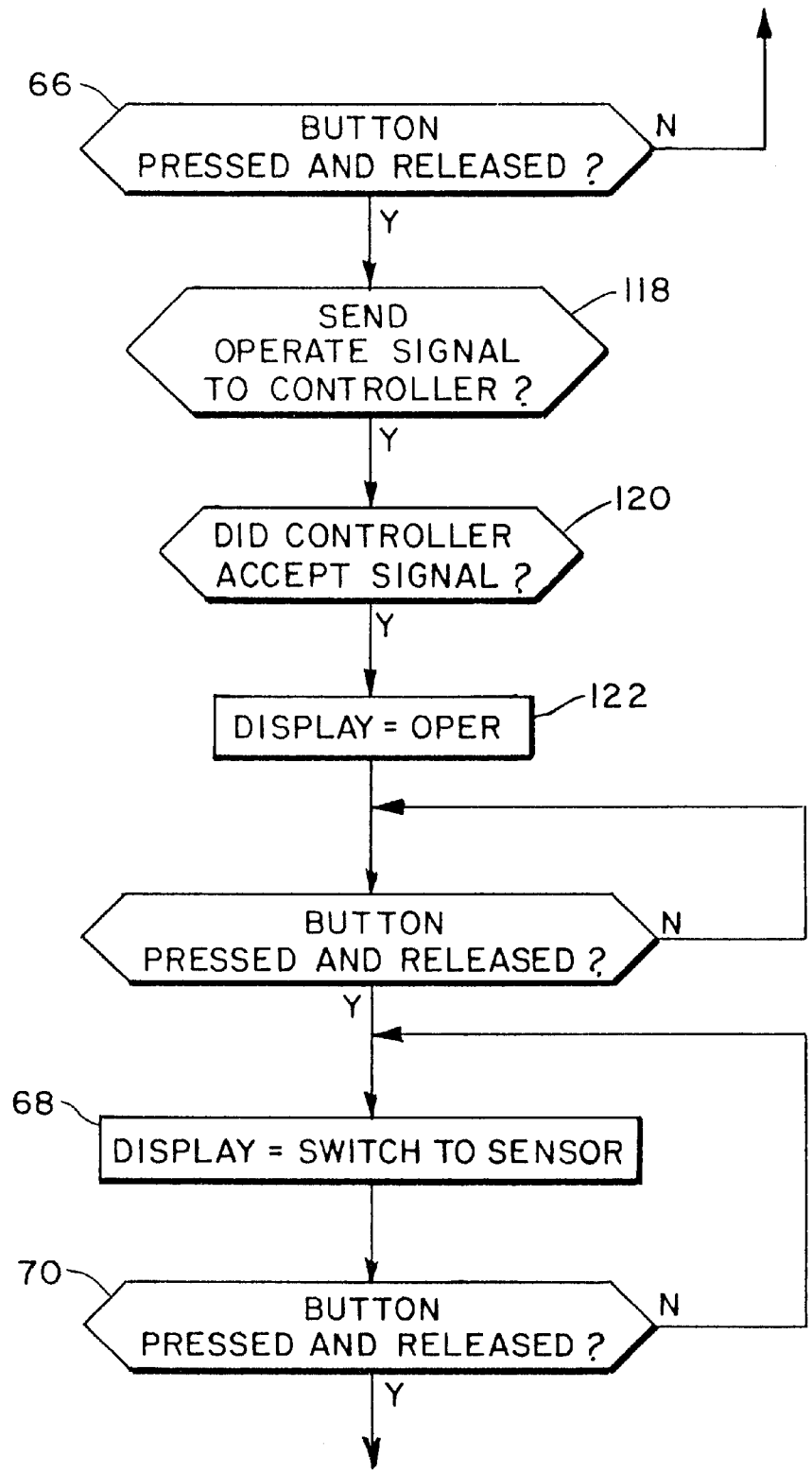
FIG. 6 is a flow diagram illustrating a first optional test performed by the test device of FIG. 1.
Figure 7:
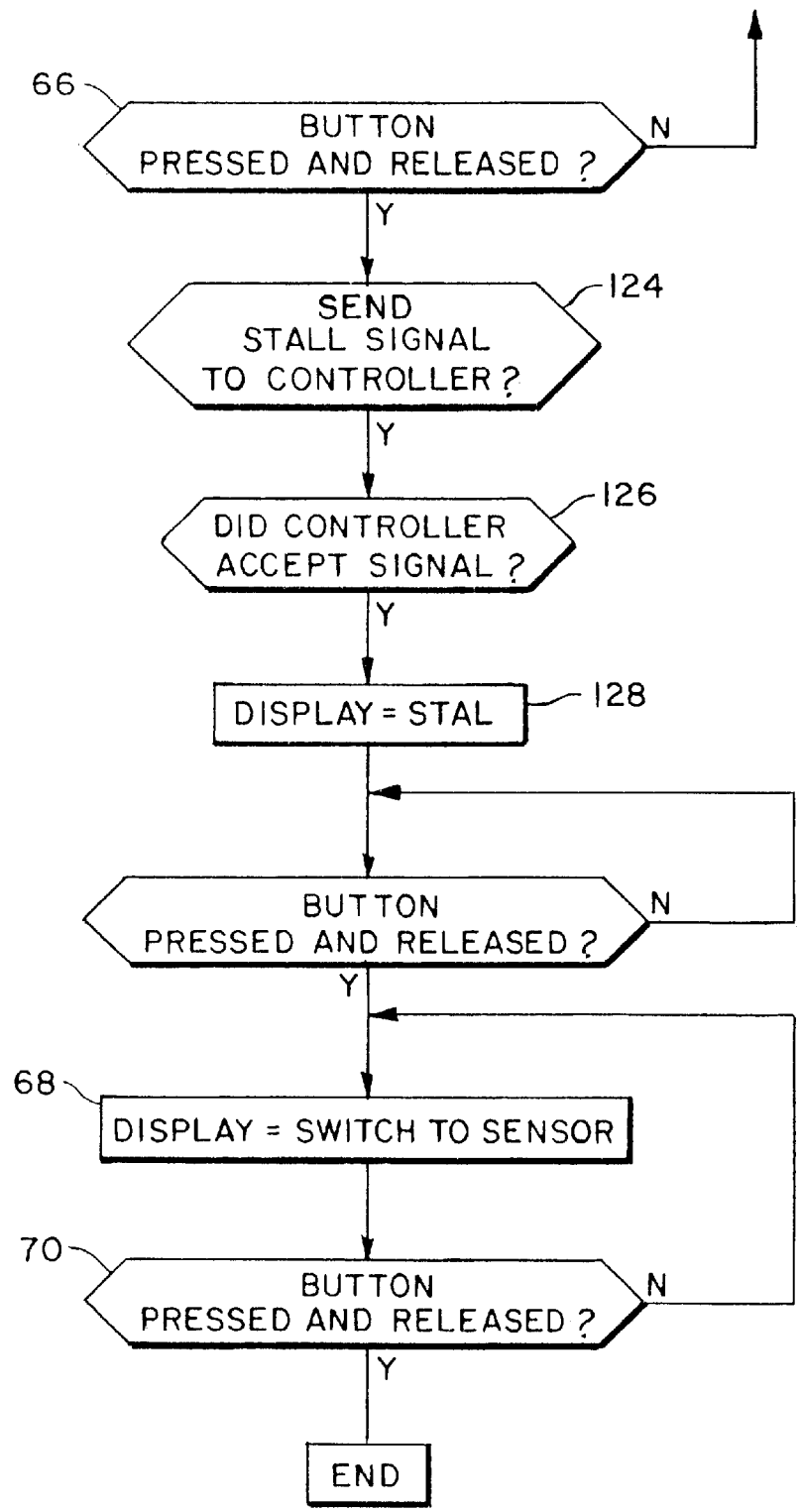
FIG. 7 is a flow diagram illustrating a second optional test performed by the test device of FIG. 1.

The test device 10 may optionally perform two additional tests on the automatic door system controller 12. With reference to FIG. 6, the micro-controller 32 can be programmed to send a signal 118 which is equivalent to the "operate" signal which is normally transmitted by the automatic door system sensors 14. If the signal is accepted 120 by the controller 12, the micro-controller 32 will send a "OPER" signal 122 to the display 22. With reference to FIG. 7, the micro-controller 32 can be programmed to send a signal 124 which is equivalent to the "stall" signal which is normally transmitted by the automatic door system sensors 14. If the signal is accepted 126 by the controller 12, the micro-controller 32 will send a "STAL" signal 128 to the display 22.

Toggling the selector switch 24 to the sensor position will isolate the data signals of the controller 12 from the test device 10 and allow the test device 10 to test the sensors 14. Pressing 70 the push-button switch 26 causes the second voltage comparator circuit 42 to monitor 72 the voltage on the sensor clock line. The micro-controller 32 will send a signal to the display 22 to indicate whether the clock line voltage (V2) is above (V20K) 74 or below (V2NG) 76 a predetermined minimum level. Pressing 78 the push-button 26 steps the micro-controller 32 to monitor 80 the sensor data line voltage with the third voltage comparator 53. The micro-controller will send a signal to the display 22 to indicate whether the data line voltage (V3) is above (V30K)

82 or below (V3NG) 84 a predetermined minimum level. If either V2NG 76 or V3NG 84 is displayed, either the Flex-Link™ cable is shorted or a sensor 14 is defective.

After verifying that the voltages are correct, the push-button switch 26 is pressed 86 to initiate a test 88 of each individual sensor. For each sensor 14, the test comprises a first part where the micro-controller 32 sends a first data signal 90 addressing a specific sensor. When communication with the sensor 14 has been established, the micro-controller 32 sends a second data 92 signal directing the sensor 14 to output a specific zone pattern 94 for detecting the presence of a person/object 96. When the sensor 14 initiates output of the zone pattern 94, an object 96 may or may not be within the zone 94. If the sensor 14 detects the presence of an object 96, the micro-controller 32 will send a "SXON" signal 98 (where "X" is the sensor number) to the display 22 to indicate the presence of an object detection signal from the sensor 14. Conversely, if the sensor 14 does not detect the presence of an object 96, the micro-controller 32 will send a "SXNC" signal 100 to the display 22 to indicate the absence of an object detection signal from the sensor 14.

The sensor 14 is tested by attempting to change the status of the object detection signal. That is, if the "SXNC" signal 100 is being displayed, the operator will introduce an object 96, such as his hand, into the zone 94. If the sensor 14 is operating satisfactorily, the sensor receiver 102 will receive a return signal 104 from the object 96 and thereby sense the presence of this object 96 and send a signal to the test device 10. Upon receipt of this signal, the micro-controller 32 sends a "SXON" signal 98 to the display 22. Conversely, if the "SXON" signal 98 is being displayed, the operator will cover the emitter lens 106 or receiver 102. Since the receiver 102 will no longer receive a return signal 104 from the object 96 in the zone 94, it will appear as if the object 96 has been removed from the zone 94. Consequently, the sensor 14 will cease sending a signal to the test device 10 and the micro-controller 32 will send the "SXNC" signal 100 to the display 22. Pushing 108 the push-button switch 26 will cause the test device to advance to the next sensor 110. When the micro-controller 32 determines 112 that all of the sensors 14 have been tested, pushing 114 the push-button 26 will cause the micro-controller 32 to display a "END" message 116 on the alphanumeric display 22.

It should be appreciated that the test device 10' may be permanently installed in the automatic door system. Since the controller 12 and the sensors 14 must be isolated from each other during testing, a permanently installed test device 10' must include controls and circuitry for inserting the test device 10' between the controller 12 and the sensors 14 during testing and for removing the test device 10' when testing is complete so that the sensors 14 may once again communicate with the controller 12.

It should also be appreciated that the test device 10 is simple to manufacture and operate, resulting in low acquisition and operating costs. The installation and removal of the portable test device 10 of the subject invention is relatively easy to accomplish and does not require complex tools or training to accomplish. In addition, use of the test device 10, 10' requires only the operation of two switches 24, 26. The test results are obtained by observation of a single LED 20 which is either on or off and an alphanumeric display 22 which provides easily understood four digit test result messages.

It should be further appreciated that the test data and control program stored in memory 34 may be customized for each type and manufacture of automatic door system. For example, the program described above is for a standard Sentrex 3™ automatic door system. Consequently, the program includes information on each sensor 14 and component of the controller 12 to ensure that they are properly tested. The test data includes normative data for comparison to the parameters which are sensed by the test device 10, 10' when the sensors 14 and controller 12 are tested. The program and test data also include steps and data necessary to transmit "operate" and "stall" signals to the controller 12 and the first and second data signals for testing the sensors 14.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A test device for an automatic door system having a controller and a plurality of sensors for sensing the presence of an object or person, the controller including a data and power path and the sensors including a data path, the test device comprising:

first and second connectors, the first connector being connectable with the controller data and power path for providing a data and power path and the second connector being connectable with the sensor data path for providing a data path;

a test circuit including a micro-controller, a memory for storing a test program, and a control switch for controlling operation of the test program by the micro-controller;

a selector switch moveable between a first position, wherein the selector switch completes a data path between the test circuit and the first connector and isolates the data path of the second connector from the test circuit and the first connector, and a second position, wherein the selector switch completes a data path between the test circuit and the second connector and isolates the data path of the first connector from the test circuit and the second connector; and a display for providing a visual indication of at least one result of the test program.

2. The test device of claim 1 wherein the test circuit further includes power supply means for receiving power from the automatic door system and a first voltage comparator for monitoring the power and the display comprises an LED for indicating the status of the power.

3. The test device of claim 2 wherein the display further comprises an alphanumeric display.

4. The test device of claim 2 wherein the data and power path of the controller and the data path of the sensors each include at least a clock line and a data line and the test circuit further includes a second voltage comparator for testing the voltage of the clock and data lines.

5. A method of testing an automatic door system with a test device, the automatic door system having a controller and a plurality of sensors for sensing the presence of an object or person, the controller and sensors each including a connector for carrying signals, the test device having first and second connectors, a test circuit including a micro-controller, a memory for storing data and a test program, and a control switch, a selector switch moveable between first and second positions, and a display, the method comprising the steps of:

disconnecting the connectors of the sensors from the connectors of the controller;

connecting the connectors of the controller and sensors to the first and second connectors of the test device, respectively;

positioning the selector switch in the first position wherein the selector switch completes a data path between the test circuit and the first connector and blocks exchange of data between the second connector and the test circuit and the first connector; and testing the automatic door system controller.

6. The method of claim 5 further comprising the step of providing power to the test device from the automatic door system.

7. The method of claim 6 wherein the step of providing power further includes monitoring the voltage of the power and providing an indication whether the voltage is above or below a predetermined minimum value.

8. The method of claim 5 wherein the connector of the controller includes a clock line and the step of testing the controller comprises the step of testing the voltage of the clock line by pressing the control switch whereby the micro-controller runs the test program to monitor the voltage of the clock line and provide an indication whether the voltage is above or below a predetermined minimum value.

9. The method of claim 8 wherein the connector of the controller further includes a data line and the step of testing the controller further comprises the step of testing the voltage of the data line by pressing the control switch whereby the micro-controller runs the test program to monitor the voltage of the data line and provide an indication whether the voltage is above or below a predetermined minimum value.

10. The method of claim 9 wherein the step of testing the controller further comprises the step of monitoring the signals on the clock line by pressing the control switch whereby the micro-controller runs the test program to monitor the clock line signals and provide an indication whether the clock line signals correspond to data stored in the memory.

11. The method of claim 9 wherein the step of testing the controller further comprises the step of monitoring the signals on the data line by pressing the control switch whereby the micro-controller runs the test program to monitor the data line signals and provide an indication whether the data line signals correspond to data stored in the memory.

12. The method of claim 5 wherein the step of testing the controller further comprises the step of pressing the control switch whereby the micro-controller sends an operate signal to the controller and provides an indication if the controller accepts the operate signal.

13. The method of claim 5 wherein the step of testing the controller further comprises the step of pressing the control switch whereby the micro-controller sends a stall signal to the controller and provides an indication if the controller accepts the stall signal.

14. The method of claim 5 further comprising the steps of:

positioning the selector switch in the second position wherein the selector switch completes a data path between the test circuit and the second connector and blocks exchange of data between the first connector and the test circuit and the second connector; and testing the automatic door system sensors.

15. The method of claim 14 wherein the connector of the sensors includes a clock line and the step of testing the sensors comprises the step of testing the voltage of the clock line by pressing the control switch whereby the micro-controller runs the test program to monitor the voltage of the clock line and provide an indication whether the voltage is above or below a predetermined minimum value.

16. The method of claim 15 wherein the connector of the sensors further includes a data line and the step of testing the sensors further comprises the step of testing the voltage of the data line by pressing the control switch whereby the micro-controller runs the test program to monitor the voltage of the data line and provide an indication whether the voltage is above or below a predetermined minimum value.

17. The method of claim 14 wherein each sensor includes an emitter for emitting an output signal into a zone and a detector for receiving an input signal indicative of the presence of a person or object within the zone and the step of testing the sensors includes testing each sensor by pressing the control switch whereby the micro-controller designates and establishes communication with one of the sensors.

18. The method of claim 17 wherein pressing the control switch also causes the micro-controller to direct the designated sensor to emit a first signal into the zone and provide an indication whether or not the designated sensor receives a second signal.

19. The method of claim 18 wherein the step of testing the sensor further includes observing the indication after the emitter begins emitting the first signal and taking either the step of placing an object into the zone if the detector is not receiving the second signal, wherein the sensor performance is satisfactory if the indication changes to show that the detector is now receiving the second signal, or covering the emitter or the detector if the detector is receiving the second signal, wherein the sensor performance is satisfactory if the indication changes to show that the detector is no longer receiving the second signal.

20. A method of testing an automatic door system with a test device, the automatic door system having a controller and a plurality of sensors for sensing the presence of an object or person, the controller and sensors each including a connector for carrying signals, the test device having first and second connectors, a test circuit including a micro-controller, a memory for storing data and a test program, and a control switch, a selector switch moveable between first and second positions, and a display, the method comprising the steps of:

electrically separating the controller and the sensors by electrically interposing the test device between the connectors of the sensors and the connectors of the controller;

electrically connecting the connectors of the controller and sensors to the first and second connectors of the test device, respectively;

providing power to the test device from the automatic door system;

positioning the selector switch in the first position wherein the selector switch completes a data path between the test circuit and the first connector and blocks exchange of data between the second connector and the test circuit and the first connector;

testing the automatic door system controller;

positioning the selector switch in the second position wherein the selector switch completes a data path between the test circuit and the second connector and blocks exchange of data between the first connector and the test circuit and the second connector;

testing the automatic door system sensors;

electrically disconnecting the connectors of the controller and sensors from the first and second connectors of the test device; and electrically connecting the controller to the sensors.

21. The method of claim 20 further comprising the step of compiling normative test data for the controller and sensors and storing the test data in the memory.

22. The method of claim 20 further comprising the step of preparing a test program for testing the controller and each sensor and storing the test program in the memory.

* * * * *